(12) United States Patent
Sato et al.

(10) Patent No.: US 9,324,778 B2
(45) Date of Patent: Apr. 26, 2016

(54) VARIABLE INDUCTOR AND SEMICONDUCTOR DEVICE USING SAME

(75) Inventors: Junji Sato, Tokyo (JP); Koichi Mizuno, Kanagawa (JP); Suguru Fujita, Tokyo (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/814,871

(22) PCT Filed: Jan. 26, 2012

(86) PCT No.: PCT/JP2012/000497
§ 371 (c)(1),
(2), (4) Date: Feb. 7, 2013

(87) PCT Pub. No.: WO2012/132179
PCT Pub. Date: Oct. 4, 2012

(65) Prior Publication Data
US 2013/0140672 A1 Jun. 6, 2013

(30) Foreign Application Priority Data
Mar. 29, 2011 (JP) .................. 2011-073445

(51) Int. Cl.
| H01F 21/12 | (2006.01) |
| H01L 49/02 | (2006.01) |
| H01L 23/522 | (2006.01) |
| H01F 21/00 | (2006.01) |
| H01F 27/28 | (2006.01) |
| H01L 27/06 | (2006.01) |

(52) U.S. Cl.
CPC .............. *H01L 28/10* (2013.01); *H01F 21/005* (2013.01); *H01F 27/2804* (2013.01); *H01L 23/5227* (2013.01); *H01F 2027/2809* (2013.01); *H01L 27/0605* (2013.01); *H01L 2924/0002* (2013.01)

(58) Field of Classification Search
CPC .......... H01F 17/0006; H01F 2021/125; H01F 21/12; H01L 23/5227; H01L 2924/3011
USPC ................................... 257/528–531; 438/381
See application file for complete search history.

(56) References Cited

U.S. PATENT DOCUMENTS 5,629,553 A * 5/1997 Ikeda .................. H01F 17/0006
257/379
6,800,533 B1 * 10/2004 Yeo et al. ...................... 438/381
(Continued)

FOREIGN PATENT DOCUMENTS

| JP | 7-142258 A | 6/1995 |
| JP | 8-45744 A | 2/1996 |
| JP | 8-162331 A | 6/1996 |
| JP | 3318086 B2 | 8/2002 |
| JP | 2002-280222 A | 9/2002 |

(Continued)

OTHER PUBLICATIONS

International Search Report, mailed May 15, 2012, for International Application No. PCT/JP2012/000497, 4 pages.

*Primary Examiner* — Jerome Jackson, Jr.
*Assistant Examiner* — Fang-Xing Jiang
(74) *Attorney, Agent, or Firm* — Seed IP Law Group PLLC

(57) ABSTRACT

A variable inductor includes a spiral inductor, a loop conductor, and a switch for opening or short-circuiting an end of the loop conductor. The loop conductor is formed in a direction perpendicular to the spiral inductor and is used for adjusting the inductance value of the spiral inductor by opening or short-circuiting the end of the loop conductor by the switch.

3 Claims, 14 Drawing Sheets

(56) References Cited

U.S. PATENT DOCUMENTS

| | | | |
|---|---|---|---|
| 6,992,366 B2 * | 1/2006 | Kim | H01F 21/12 257/528 |
| 7,733,206 B2 * | 6/2010 | Park | H01F 17/0006 336/200 |
| 2002/0158711 A1 | 10/2002 | Groves et al. | |
| 2006/0138587 A1 * | 6/2006 | Choi | 257/528 |

FOREIGN PATENT DOCUMENTS

| | | |
|---|---|---|
| JP | 2005-347286 A | 12/2005 |
| JP | 2006-32579 A | 2/2006 |
| JP | 2006-245455 A | 9/2006 |
| JP | 2007-5498 A | 1/2007 |
| JP | 2008-16703 A | 1/2008 |

* cited by examiner (a)

(b)

(a)

(b)

(a)

(b)

VARIABLE INDUCTOR AND SEMICONDUCTOR DEVICE USING SAME

TECHNICAL FIELD

The invention relates to a variable inductor and a semiconductor device using the same and a technique of controlling an inductance value of an inductor, which makes up a matching circuit, in a semiconductor device that is formed by use of; for instance, CMOS processes, and used at ultrahigh frequency bands, including millimeter wave frequency bands.

BACKGROUND ART

Development of an MMIC (monolithic microwave integrated circuit) using CMOS processes has been pursued in a field of wireless communication using millimeter wave frequency bands, and reducing chip's area by providing a matching circuit with a lumped parameter has also been pursued.

In general, providing a matching circuit with a lumped parameter poses a problem of a band being narrowed by a self-resonant frequency of inductance or capacitance.

In a matching circuit using a lumped parameter element, the matching circuit is generally made variable in order to enhance a narrow band characteristic. A conceivable way to make internal capacitance of the matching circuit variable is to employ a varactor or make the capacitance parallel and control the capacitance by turning a switch on or off. However, using the varactor or the switch at millimeter wave frequency bands causes a problem of an increase in loss of the matching circuit.

A configuration for controlling an inductance value of an inductor; for instance, has been proposed as a method for solving the problems (see; for instance, Patent Document 1 and Patent Document 2).

FIG. 13 is a schematic diagram of a variable inductor described in Patent Document 1. In FIG. 13, an inductance variable element 101 has a swirl-like spiral electrode 102 and switches 105 and 106 that are intended to short-circuit an electric current flowing between input-output electrodes 103 and 104 by short-circuiting turns of the spiral electrode 102.

The switch 105 is formed from a gate electrode 107 and diffusion regions 109 and 110 which are made in such a way that the gate electrode 107 is sandwiched therebetween, and the switch 106 is formed from a gate electrode 108 and diffusion regions 110 and 111 which are made in such a way that the gate electrode 108 is sandwiched therebetween. The inductance variable element 101 and the switches 105 and 106 are formed on a silicon substrate 113 by way of a dielectric layer 112.

The diffusion regions 109, 110, and 111 are made over a surface of the n-type silicon substrate 113 by thermal diffusion or ion implantation of p-type impurities.

An inductance value of the variable inductor is determined from a length of the spiral electrode 102 between the input-output electrodes 103 and 104. In the variable inductor, the length of the spiral electrode 102 between the input-output electrodes 103 and 104 can be shortened by turning on the switch 105 and shortened further by additionally turning on the switch 106.

FIG. 14 shows a schematic diagram of a variable inductor described in connection with Patent Document 2. In FIG. 14, the variable inductor includes a spiral coil 201, a first layer 202 of the spiral coil, a second layer 203 of the spiral coil, a control circuit 204, a switch 205, a silicon substrate 206, circumferential wiring 207, a first layer 208 of the circumferential wiring, and a second layer 209 of the circumferential wiring.

The variable inductor of Patent Document 2 is configured as follows. The circumferential wiring 207 is laid around the spiral coil 201. The switch 205 is put at one end of the circumferential wiring 207. The switch is turned on or off by a control signal sent from the control circuit 204, thereby opening or short-circuiting the one end of the circumferential wiring 207.

In a state in which the one end of the circumferential wiring 207 is short-circuited when compared with a state in which the one end of the circumferential wiring 207 is opened, a magnetic flux developing in the spiral coil 201 penetrates through the circumferential wiring 207, whereby an induction current flows through the circumferential wiring 207, to thus cancel the magnetic flux of the spiral coil 201 and reduce an inductance value of the spiral coil 201. Namely, the one end of the circumferential wiring 207 is opened or short-circuited by turning on or off the switch 205, thereby making the inductance value variable.

PRIOR ART DOCUMENT

Patent Document

Patent Document 1: JP-B-3318086
Patent Document 2: JP-A-2008-16703

SUMMARY OF THE INVENTION

Problems to be Solved by the Invention

In the configuration of the inductor described in connection with Patent Document 1, the inductance value can be changed by turning on or off the switch. However, since the switch is placed in series with the inductor, there is a problem of a loss being increased at millimeter wave frequency bands under influence of the switch.

In the configuration of the inductor described in connection with Patent Document 2, the inductance value can be changed according to a condition of the circumferential wiring 207. However, changing the inductance value requires a wiring area around the inductor, which poses a problem of an increase in inductor's area.

Moreover, a lower portion of the input-output line of the inductor turns into the wiring area as a result of the circumferential wiring being laid around the inductor. Accordingly, the input-output line of the inductor becomes longer, which presents a problem of an increased loss.

The invention has been conceived in light of the circumstance and aims at providing a low-loss variable inductor that provides a wider controllable frequency band without increasing inductor's area and a semiconductor device using the same.

Means for Solving the Problems

A variable inductor of the invention is directed toward a variable inductor including a spiral inductor formed on a semiconductor substrate, a loop conductor, and a switch adapted to open or short-circuit one end of the loop conductor, wherein the loop conductor is placed in a layer which is lower than the spiral inductor, and an inductance value of the spiral inductor is changed by opening or short-circuiting the one end of the loop conductor by use of the switch.

The configuration makes it possible to control an inductance value without increasing area of the variable inductor.

The invention is also directed to the variable inductor, wherein the loop conductor is formed in a vertical direction with respect to the spiral inductor.

In the configuration, the loop conductor is formed in the vertical direction with respect to the spiral inductor. Hence, the area of the loop conductor can be reduced. Even when a switch is formed by use of a transistor including a MOSFET, the switch can be accommodated in a region below the area where the spiral inductor is formed.

The invention is also directed toward the variable inductor, wherein the spiral inductor is formed on one surface of the semiconductor substrate; and the loop conductor includes a first layer conductor formed in a layer which is lower than the spiral inductor, a second layer conductor formed in a layer which is lower than the first layer conductor, a vertical conductor formed in a via which is formed in at least a part of the semiconductor substrate in a direction perpendicular to the one surface and which connects the first layer conductor to the second layer conductor, and the switch adapted to open or short-circuit the one end of the loop conductor.

In the configuration, the loop conductor forms a loop that is perpendicular to one surface of the semiconductor substrate, whereby a large loop area can be assured on the semiconductor substrate without increasing the area of the loop conductor. Since an induced current flowing through the loop conductor consequently undergoes large influence of a magnetic flux induced by the spiral inductor, an inductance value of the variable inductor can be greatly changed. Moreover, the loop conductor can be formed in a semiconductor integrated circuit device, which serves as an oscillation circuit, without increasing the number of steps by changing a mask pattern in a step of forming a conductor pattern for wiring purpose in manufacturing processes.

The invention is also directed to the variable inductor, wherein the semiconductor substrate is a silicon substrate; the spiral inductor is formed from a surface conductor formed on a topmost layer of the silicon substrate; the first conductor is an inner layer conductor positioned at a lower layer side with respect to the surface conductor through an interlayer dielectric film; the second conductor is a backside conductor formed on a back side of the silicon substrate; and the loop conductor includes the inner layer conductor, the vertical conductor formed in a pass-through via which penetrates through the silicon substrate, the backside conductor, and the switch adapted to open or short-circuit the one end of the loop conductor.

By the configuration, the loop area of the loop conductor can be increased, and consequently the loop conductor can undergo much greatly influence of the magnetic flux developing in the spiral inductor. Hence, a variable range of an inductance value of the variable inductor can be made greater. Further, since the backside conductor is used, a larger loop can be formed, and a variable range of the inductance value can be made broader.

The invention is directed to the variable inductor, wherein the loop conductor is located below or inside a region surrounded by an outermost peripheral line constituting the spiral inductor.

In the configuration, inductance of the variable inductor can be efficiently changed without increasing the area, which would otherwise be attributable to the loop conductor.

The invention is also directed toward the variable inductor, wherein the switch includes a variable resistor connected to the one end of the loop conductor, and controls an inductance value of the spiral inductor by controlling a resistance value of the variable resistor.

In the configuration, an amount of induced current flowing through the loop conductor can be controlled by controlling the resistance value of the variable resistor connected to the loop conductor. As a consequence, the inductance value of the variable inductor can be controlled with superior accuracy.

The invention is directed toward the variable inductor, wherein a plurality of loop conductors are provided beneath the spiral inductor.

In the configuration, amounts of induced currents flowing through the plurality of loop conductors can be controlled, respectively. As a consequence, the inductance value of the variable inductor can be controlled with superior accuracy, and a control range of inductance value can be enlarged.

The invention is directed toward the variable inductor, wherein the loop conductor has a spiral shape which is turned a plurality of times in a direction perpendicular to a surface of the semiconductor substrate in which the spiral inductor is formed, and the switch opens or short-circuits the one end of the loop conductor to change the number of turns of the loop conductor.

In the configuration, amounts of induced current flowing through the plurality of loop conductors can be controlled respectively. Hence, as a consequence, the inductance value of the variable inductor can be controlled with superior accuracy, and a control range of the inductance value can be increased. Further, a change in magnetic flux due to a change in induced current can be increased by increasing the number of turns of the loop, so that the control range of inductance can be enlarged.

A semiconductor device of the invention includes the variable inductor.

By the configuration, a variable inductor can be formed on the semiconductor substrate that makes up a CMOS circuit, like an oscillation circuit. Therefore, a frequency of a high frequency circuit can be controlled by use of the circuit for a matching circuit, and the like.

Advantageous Effects of the Invention

In the variable inductor of the invention, a loop conductor using a pass-through via that penetrate through a silicon substrate is placed in a layer located lower than a spiral inductor. One end of the loop conductor is opened or short-circuited by a switch, thereby controlling an induced current flowing through the loop conductor. Thereby, an inductance value can efficiently be changed at a high frequency band. Accordingly, a variable matching circuit used in a case where matching of a wide band, as in millimeter wave frequency bands, must be controlled, can be configured.

MODE FOR CARRYING OUT THE INVENTION

Embodiments of the invention are hereunder described by reference to the drawings.

(First Embodiment)

A first embodiment of the invention is now described by reference to the drawings.

Figure 1:
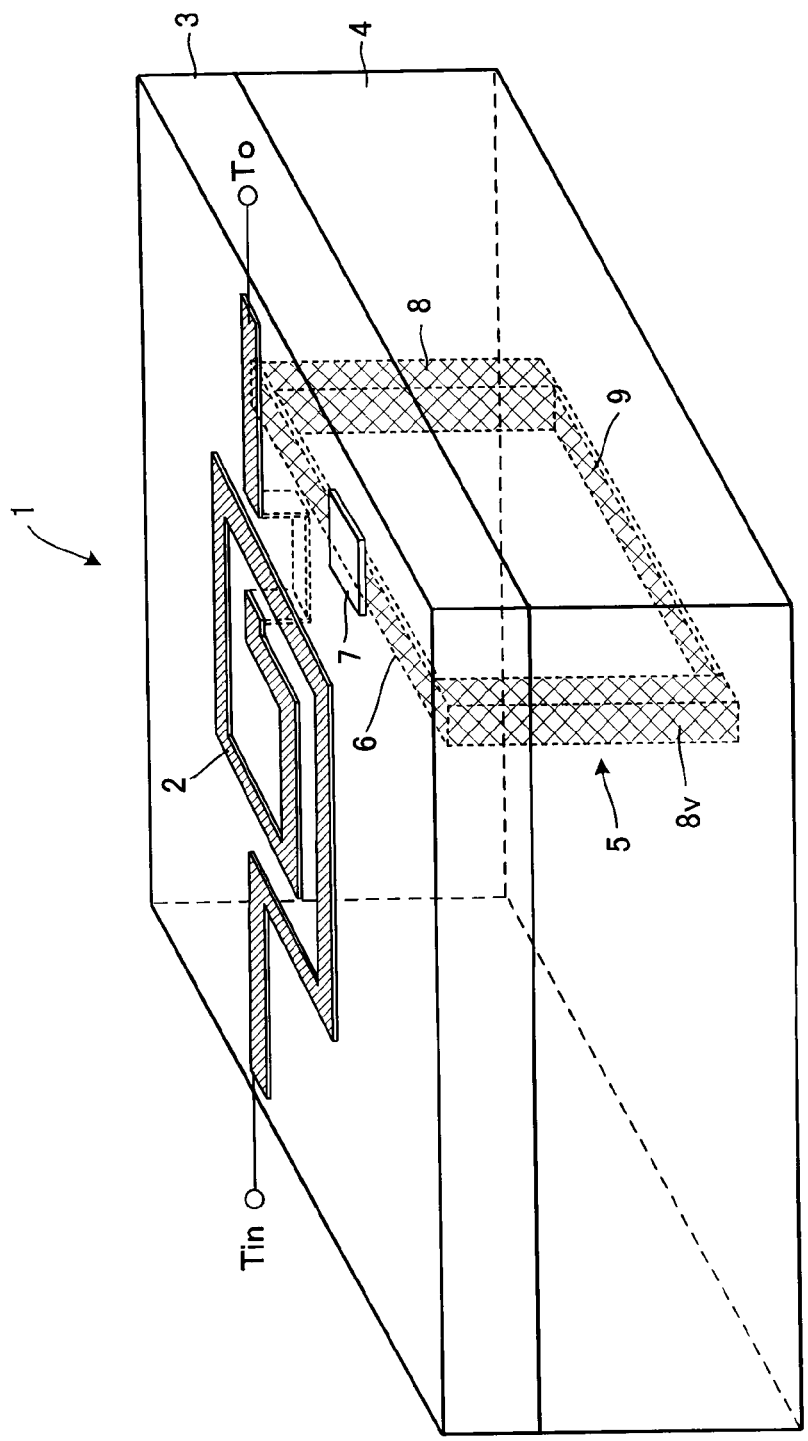
FIG. 1 is a schematic diagram of a variable inductor of a first embodiment of the invention.

FIG. 1 is a schematic diagram of a variable inductor of a first embodiment. FIG. 2(a) is a top view of the variable inductor 1; FIG. 2(b) is a cross sectional view taken along line A-A; and FIG. 2(c) is a cross sectional view taken along line B-B. FIG. 3 is schematic drawings of a semiconductor integrated circuit device 100 including the variable inductor 1; FIG. 3(a) is an equivalent circuit of the semiconductor integrated circuit device 100, and FIG. 3(b) is a schematic block diagram of the semiconductor integrated circuit device 100.

As illustrated in FIGS. 3(a) and (b), the variable inductor 1 is populated on a semiconductor integrated circuit board (a silicone substrate 4) on which a CMOS semiconductor element including a transistor 20 or a capacitor 21 is populated, to thus constitute the semiconductor integrated circuit device 100. FIG. 1 and FIGS. 2(a) to (c) show the variable inductor, and other element regions are omitted from the drawings.

Figure 2:
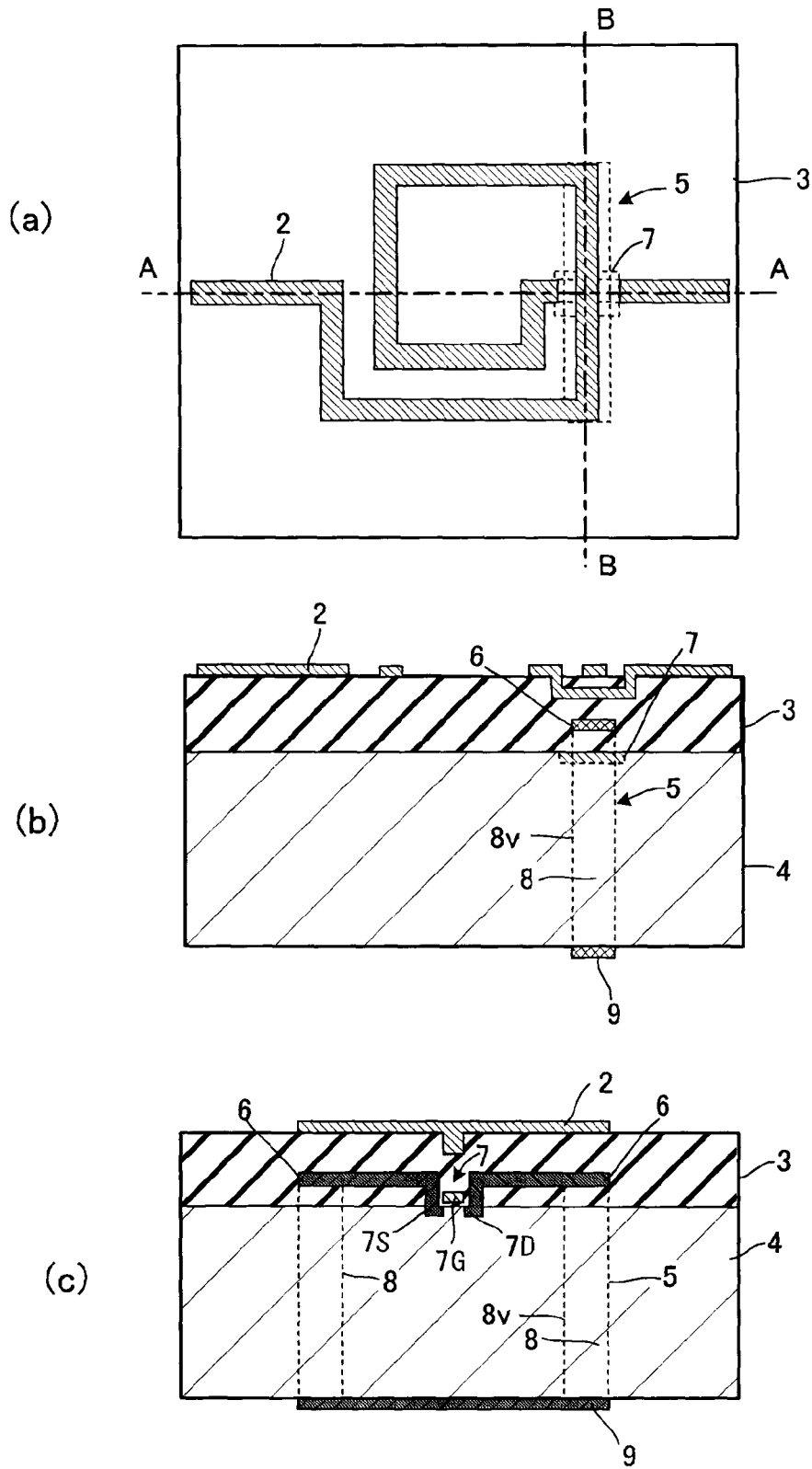
FIG. 2 is drawings illustrating the variable inductor of the first embodiment of the invention, wherein (a) is a top view, (b) is a cross sectional view taken along line A-A illustrated in (a), and (c) is a cross sectional view taken along line B-B illustrated in (a).
Figure 3:
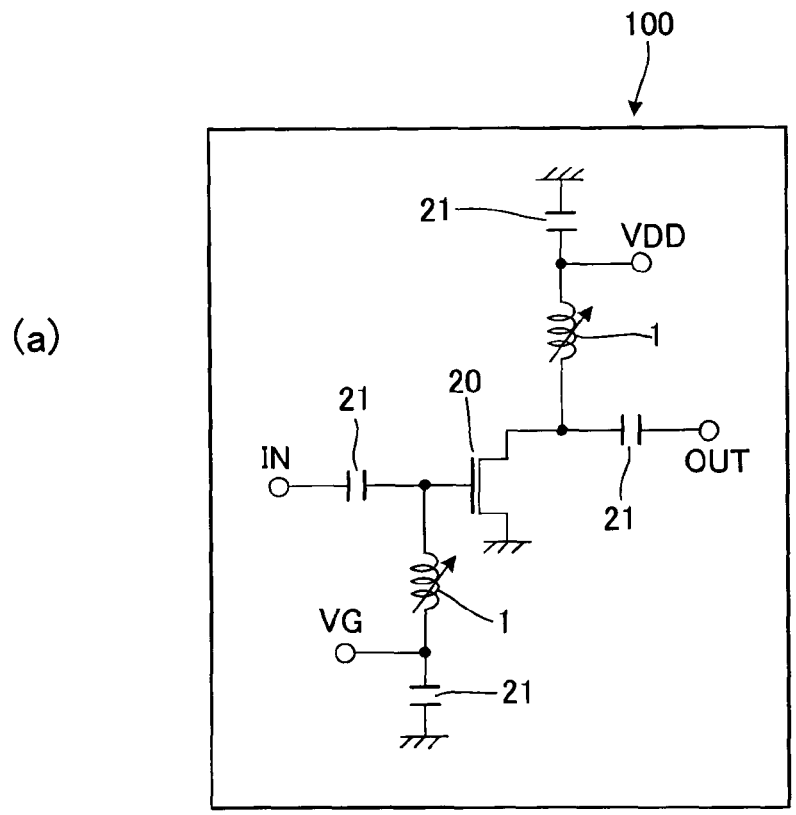
FIG. 3 is drawings illustrating a semiconductor device using the variable inductor of the first embodiment of the invention, wherein (a) is an equivalent circuit and (b) is a schematic block diagram.
Figure 3:
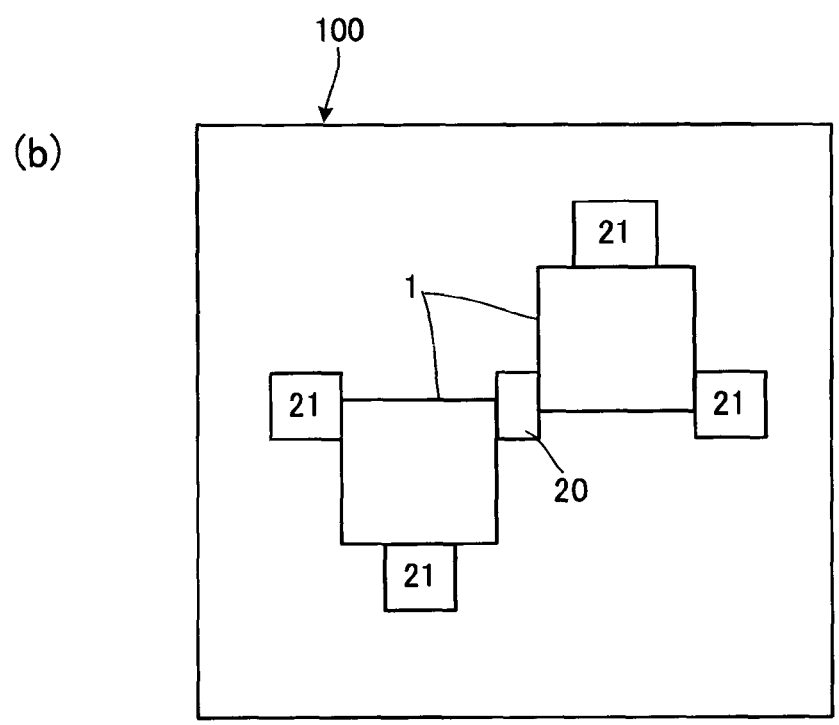

As illustrated in FIGS. 1 and 2, the variable inductor 1 includes a spiral inductor 2 formed over a surface of the silicon substrate 4 serving as a semiconductor substrate, a loop conductor 5 made in a direction perpendicular to the spiral inductor 2, and a switch 7. One end of the loop conductor 5 is opened or short-circuited by the switch 7, thereby making an inductance value of the spiral inductor 2 variable.

Area of the variable inductor 1 is a region occupied by the loop conductor 5 and the switch 7 illustrated in FIG. 2(a) and corresponds to an area as against surface of the silicon substrate 4.

The spiral inductor 2 is formed on the surface of the silicon substrate 4, which acts as a semiconductor substrate, from a surface conductor that uses a spiral gold layer pattern laid on the topmost surface layer by way of an interlayer dielectric film 3.

The loop conductor 5 is formed from an aluminum layer pattern serving as an inner layer conductor 6, an aluminum layer pattern serving as a backside conductor 9, a vertical conductor 8, and the switch 7.

Illustration of a layout relationship between the switch 7 and the aluminum layer pattern serving as the inner layer conductor 6 in FIG. 1 is simplified. A more detailed layout relationship is illustrated in FIGS. 2(b) and (c).

The aluminum layer pattern serving as the inner layer conductor 6 is positioned on a lower layer side with respect to the surface conductor by way of the interlayer dielectric film 3. An aluminum layer pattern serving as the backside conductor 9 is formed on a back surface of the silicon substrate 4. The vertical conductor 8 is formed in a pass-through via 8v that passes through the silicon substrate 4. The switch 7 opens or short-circuits one end of the loop conductor.

As illustrated in FIG. 2(c), the switch 7 is made up of a gate electrode 7G, a source region 7S, and a drain region 7D such that the gate electrode 7G is sandwiched between the source region 7S and the drain region 7D. The source region 7S and the drain region 7D are connected to the loop conductor 5, thereby opening or short-circuiting one end of the loop conductor 5.

Operation for controlling matching action of a semiconductor integrated circuit device serving as an oscillation circuit is hereunder described by use of the variable inductor with the above configuration.

The variable inductor 1 includes the spiral inductor 2 formed in the interlayer dielectric film 3 and the loop conductor 5 formed in the interlayer dielectric film 3 and the silicon substrate 4. In order to diminish a conductor loss, the spiral inductor 2 is formed by use of a gold layer pattern that serves as top metal in common CMOS processes.

The loop conductor 5 forms an annular conductor from the inner layer conductor 6 that is inner wiring of the interlayer dielectric film 3, the vertical conductor 8 formed in the pass-through via 8v that passes through the interlayer dielectric film 3 and the silicon substrate 4, and the backside conductor 9 placed on a back side of the silicon substrate 4. A portion of the loop conductor 5 formed from an inner layer conductor can be opened or short-circuited by the switch 7. These conductors are each formed from a conductor including aluminum.

When the switch 7 is opened, an induced current does not arise in the loop conductor 5 even if a magnetic flux developed in the spiral inductor 2 penetrates through an interior of the loop conductor 5. For this reason, the inductance value of the spiral inductor 2 remains unchanged.

When the switch 7 is short-circuited, the loop conductor 5 comes into a closed loop. Therefore, the magnetic flux developed in the spiral inductor 2 passes through the loop conductor 5. Therefore, the induced current flows into the loop conductor 5, whereupon a magnetic flux that cancels the magnetic flux of the spiral inductor 2 develops. Therefore, the inductance value of the spiral inductor 2 decreases.

It is possible to control the induced current developed in the loop conductor 5 and the inductance value of the spiral inductor 2 by controlling opening or short-circuiting of the switch 7.

A positional relationship between the spiral inductor 2 and the loop conductor 5 is now described. FIG. 2(a) shows a top view of the variable inductor 1, and FIG. 2(b) is a cross sectional view taken along line A-A. The loop conductor 5 is situated in a lower portion of a line made by the spiral inductor 2. The inner layer conductor 6 making up the loop conductor 5 is formed in a wiring layer that is located beneath a wiring layer to be used in the spiral inductor 2.

The switch 7 is formed from a transistor. The switch 7 is formed on an upper surface of the common silicon substrate 4 (i.e., a position between the silicon substrate 4 and the interlayer dielectric film 3). The inner layer conductor 6 and the switch 7 are connected to each other through a via formed in the interlayer dielectric film 3. Although the pass-through via 8v is used for forming the loop conductor 5, the loop conductor 5 can be formed in the interlayer dielectric film 3 without use of the pass-through via 8v.

However, an interlayer film used in common CMOS processes is as thin as micrometers, and difficulty is encountered in assuring a sufficient height for the loop conductor 5. Thus, an area surrounded by the loop conductor 5 becomes smaller. Accordingly, the loop conductor becomes less susceptible to influence of the magnetic flux of the spiral inductor 2. Hence, a range of control of an inductance value also becomes smaller. Consequently, it is desirable that the pass-through via 8v be used in forming the loop conductor 5.

By the configuration, such as that mentioned above, the loop conductor 5 that controls the inductance value of the spiral inductor 2 is positioned beneath the spiral inductor 2 and in a direction perpendicular to the spiral inductor 2. The inductance value can thereby be controlled without increasing the area occupied when the variable inductor 1 is formed. Further, the input-output line of the spiral inductor 2 does not need to be extended more than necessary; hence, a loss of the inductor can be diminished.

FIG. 3 shows schematic diagrams of a semiconductor integrated circuit device 100 including the variable inductor 1. FIG. 3(a) is an example equivalent circuit of the semiconductor integrated circuit device 100, and FIG. 3(b) is a schematic block diagram of the semiconductor integrated circuit device 100. As illustrated in FIGS. 3(a) and (b), the semiconductor integrated circuit device 100 includes the transistor 20 and the capacitor 21 in addition to including the variable inductor 1. Other elements are commonly arranged in close proximity to a periphery of the variable inductor 1.

Even in the configurations illustrated in FIG. 3, the influence of the loop conductor 5 on the transistor 20 or the capacitor 21 can be reduced by placing the loop conductor 5 beneath or inside the spiral inductor 2. On the contrary, when the loop conductor 5 is arranged outside a position beneath the spiral inductor 2, the area of the spiral inductor 2 is increased, and the influence on the transistor 20 or the capacitor 21 becomes greater.

As above, according to the embodiment, the loop conductor 5 is formed beneath the spiral inductor 2 and in a direction perpendicular to the spiral inductor 2. Opening or short-circuiting of a portion of the inner layer conductor 6 that makes up the loop conductor 5 is controlled by turning on or off the switch 7. Hence, the inductive electric current developing in the loop conductor 5 can be controlled. As a consequence, the inductance value can be controlled while the area of the variable inductor 1 is miniaturized.

Moreover, the size of the loop conductor 5 can be changed without affecting the size of the spiral inductor 2. Hence, a circumferential length of the loop conductor 5 (i.e., an area of a region surrounded by the loop conductor 5) can be controlled by elongating and contracting; for instance, a pattern length of the inner layer conductor 6 or the backside conductor 9.

Instead of the pass-through via, a via is formed to a desired depth, whereby the length of the vertical conductor 8 in the pass-through via 8v can be controlled, and the circumferential length of the loop conductor 5 (an area of the region surrounded by the loop conductor 5) can be controlled. Although the loop conductor can be formed from a via extended up to an intermediate layer, an internal area of the loop becomes smaller. Therefore, mutual inductance becomes smaller, and a range of inductance control becomes smaller.

According to the embodiment, the shape of the loop conductor 5 can be determined in accordance with a control level of inductance value of the variable inductor 1.

Further, when the loop conductor 5 is placed in the lower portion of the spiral inductor 2, the influence of the magnetic flux of the spiral inductor 2 varies according to a location where the loop conductor 5 is placed. Therefore, a layout and a position of the loop conductor 5 can be determined in accordance with the control level of the inductance value of the variable inductor 1.

In steps of forming a conductor pattern to be used for wiring in processes of manufacturing the semiconductor integrated circuit device 100, the loop conductor can be formed without increasing the number of steps by changing the mask pattern used for forming a surface conductor and a backside conductor. Alternatively, when the pass-through via is formed in the semiconductor integrated circuit device 100, the pass-through via is also formed through the same processes even in connection with steps of forming the pass-through via.

Alternatively, when the pass-through via is formed in the midstream of the steps, in a subsequent step another via to be connected to the vertical conductor formed in the pass-through via may additionally be formed and connected in the vertical direction.

As above, according to the embodiment, the loop conductor is formed into a loop perpendicular to one surface of the semiconductor substrate, whereby an area of the loop can be increased without increasing the area of the loop conductor in the semiconductor substrate.

The influence of the magnetic flux developing in the spiral inductor can be made greater by the induced current flowing through the loop conductor, so that the inductance value of the variable inductor can be greatly changed. Moreover, in the semiconductor integrated circuit device 100 acting as an oscillation circuit, the loop conductor can be formed without increasing the number of steps by alteration of the mask pattern in the steps of forming a conductor pattern used for wiring in the manufacturing processes.

In the embodiment, the switch 7 is used for opening or short-circuiting the loop conductor 5. However, instead of the switch 7, resistors, for instance, can also be connected in parallel, to thus form a variable resistor. The induced current flowing through the loop conductor 5 can be controlled by controlling the resistance value. By the configuration, the inductance value of the variable inductor 1 can be controlled with superior accuracy.

As mentioned above, the loop conductor 5 is formed right beneath or inside the position right beneath the line that makes up the spiral inductor 2, whereby the inductance value can be controlled without increasing the area of the variable inductor 1.

The loop conductor, however, is not limited to the interior of the spiral inductor but can also extend outside the spiral inductor or can also be formed from the inside to the outside of the spiral inductor.

The variable inductor described in connection with the embodiment is used as a matching circuit of a high frequency circuit described in connection with the embodiment, whereby a matching state of the matching circuit can be controlled, and a match can be controlled over a wide frequency band.

(Second Embodiment)

A second embodiment of the invention is now described by reference to the drawings.

Figure 4:
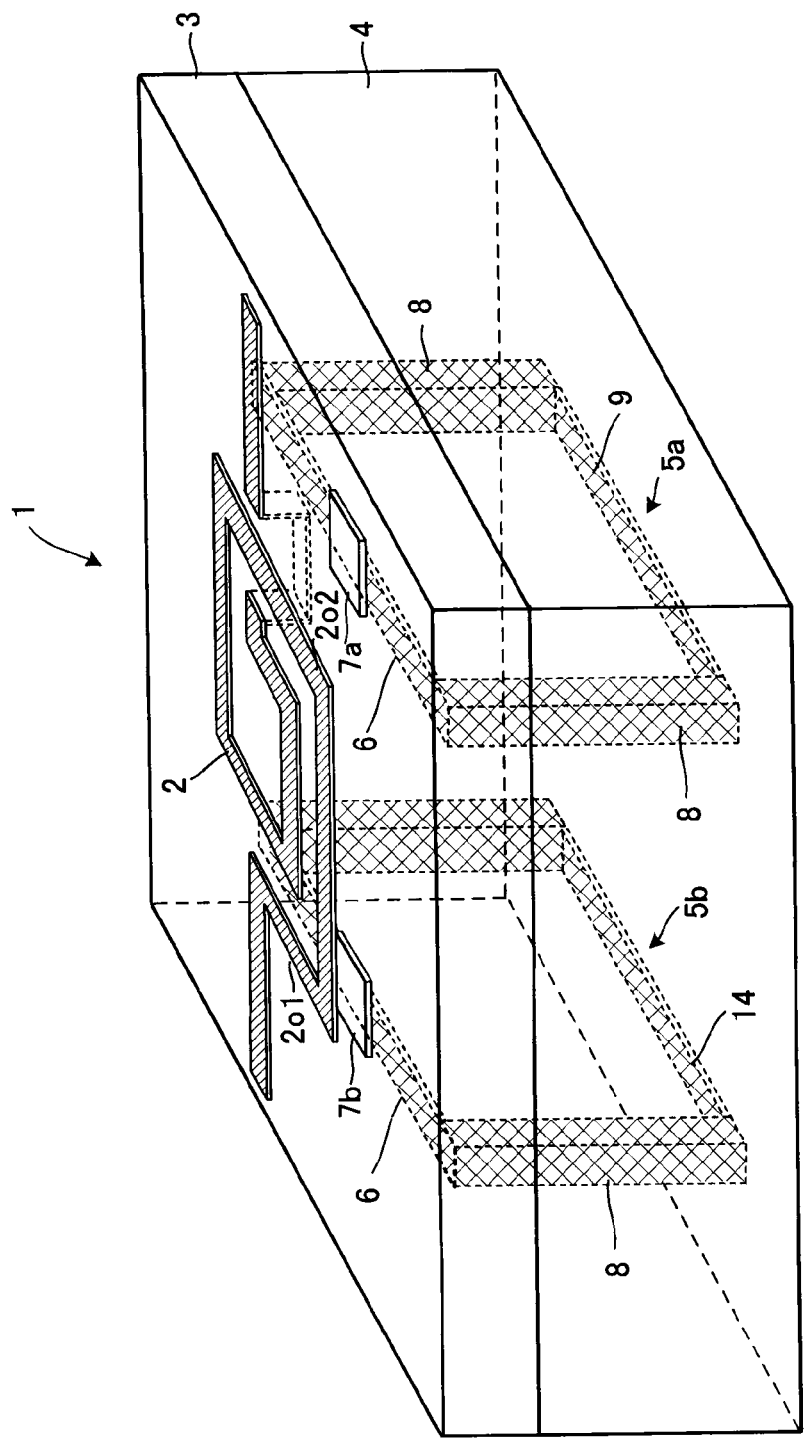
FIG. 4 is a schematic diagram of a variable inductor of a second embodiment of the invention.

FIG. 4 is a schematic diagram of a variable inductor of a second embodiment. FIG. 5(a) is a top view of the variable inductor 1, and FIG. 5(b) is a cross sectional view taken along line A-A.

As in the case with the first embodiment, the variable inductor 1 is populated on the semiconductor integrated circuit board (the silicon substrate 4) on which the CMOS semiconductor element including the transistor 20 or the capacitor 21 is populated, thereby making up the semiconductor integrated circuit device 100 (see FIGS. 3(a) and 3(b)). The variable inductor is illustrated in the embodiment, and other element regions are omitted.

Figure 5:
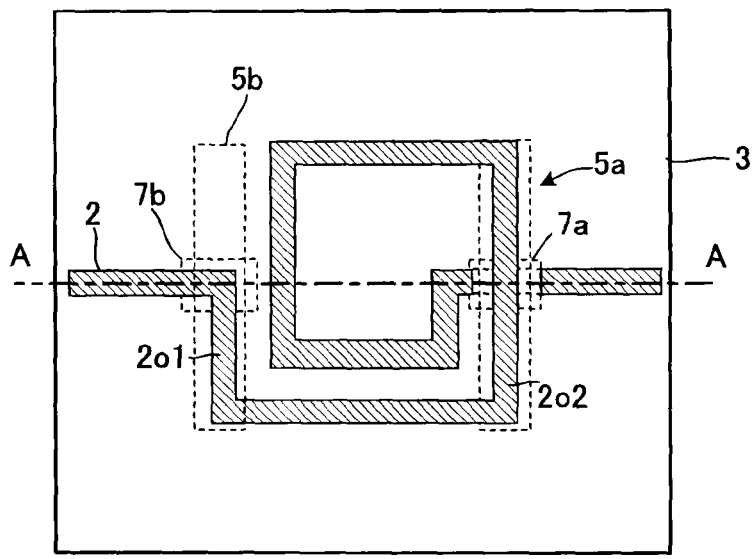
FIG. 5 is drawings illustrating the variable inductor of the second embodiment of the invention, wherein (a) is a top view and (b) is a cross sectional view.
Figure 5:
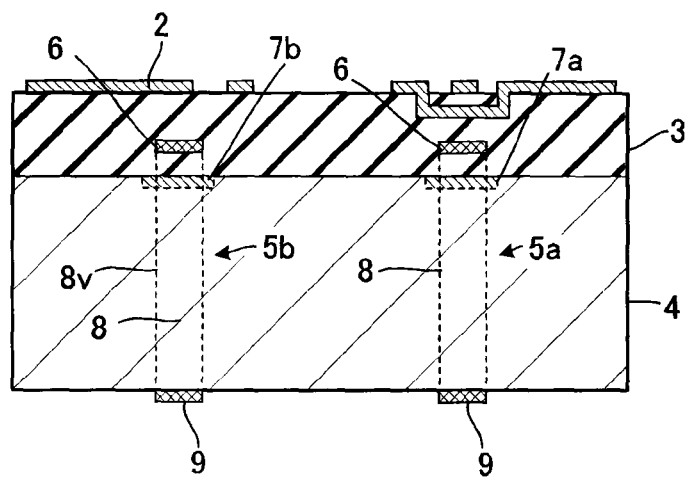

As illustrated in FIG. 5, the variable inductor 1 is made up of the spiral inductor 2 formed over the surface of the silicon substrate 4 serving as a semiconductor substrate; two loop conductors formed in a direction perpendicular to the spiral inductor 2, or first and second loop conductors 5a and 5b; and first and second switches 7a and 7b.

The first and second loop conductors 5a and 5b are formed along two mutually-opposed sides 2o1 and 2o2 of the outermost periphery of the spiral inductor 2. The respective loop conductors are the same as the loop conductor 5 described in connection with the first embodiment. The variable inductor 1 has one additional loop conductor of the same kind that opposes its counterpart loop conductor.

The respective loop conductors are formed alike by use of respective switches. Respective single ends of the first and second loop conductors 5a and 5b are opened or short-circuited by the first and second switches 7a and 7b, whereby the variable inductor 1 can change the inductance value of the spiral inductor 2.

Since the variable inductor 1 is the same as its counterpart variable inductor described in connection with the first embodiment in terms of other configurations, their repeated explanations are omitted. Like parts are given like reference numerals.

Operation of the variable inductor is hereunder described. Basic operation of the variable inductor is exactly the same as that described in connection with the first embodiment and hence omitted here for brevity. The variable inductor is provided with the first loop conductor 5a and the second loop conductor 5b. Single ends of the respective inner layer conductors 6 that make up the first and second loop conductors 5a and 5b are opened or short-circuited by turning on or off the first and second switches 7a and 7b. The variable inductor can thereby control the induced current flowing through the first loop conductor 5a and the induced current flowing through the second loop conductor 5b and can change the inductance value of the spiral inductor 2.

The spiral inductor 2 is provided with the first loop conductor 5a and the second loop conductor 5b. The induced currents develop in both the first loop conductor 5a and the second loop conductor 5b, so long as the first switch 7a and the second switch 7b are simultaneously turned on. As a consequence, the inductance value of the spiral inductor 2 can be greatly changed.

Even in the configuration, the first loop conductor 5a and the second loop conductor 5b can be formed beneath the spiral inductor 2 in the vertical direction as illustrated in FIGS. 5(a) and 5(b). Therefore, the variable range of the inductance value can be made larger without increasing the area of the variable inductor 1 on one surface of the semiconductor substrate.

According to the embodiment, in the semiconductor integrated circuit device 100, the first loop conductor 5a and the second loop conductor 5b are formed in the lower portion of the spiral inductor 2 in a direction perpendicular to the spiral inductor 2. Opening or short-circuiting of a portion of the inner layer conductor 6 that makes up the first loop conductor 5a is controlled by turning on or off the first switch 7a. Opening or short-circuiting of a portion of the inner layer conductor 6 that makes up the second loop conductor 5b is controlled by turning on or off the second switch 7b. Accordingly, the induced current developed in the first loop conductor 5a and the induced current developed in the second loop conductor 5b can be controlled. As a consequence, the inductance value can be greatly controlled while the area of the variable inductor 1 is miniaturized.

When the first loop conductor 5a and the second loop conductor 5b are placed in the lower portion of the spiral inductor 2, the influence of the magnetic flux of the spiral inductor 2 varies according to a location where the loop conductors are placed. For this reason, the layout and the location of the first loop conductor 5a and those of the second loop conductor 5b can be determined according to a control level of the inductance value of the variable inductor 1. For instance, the first loop conductor 5a and the second loop conductor 5b are formed right below a conductor pattern (a line) making up the spiral inductor 2 or inside of the location right below the conductor pattern, whereby the inductance value can be controlled without increasing the area of the variable inductor 1.

In the embodiment, the first switch 7a and the second switch 7b are used for opening or short-circuiting the first loop conductor 5a and the second loop conductor 5b. However, for instance, resistors are arranged in parallel to each other, to thus form a variable resistor. The induced current flowing through the first loop conductor 5a and the induced current flowing through the second loop conductor 5b can be controlled by controlling a resistance value of the variable resistor instead of the switches. Accordingly, the inductance value of the variable inductor 1 can be controlled with superior accuracy.

(Third Embodiment)

Figure 6:
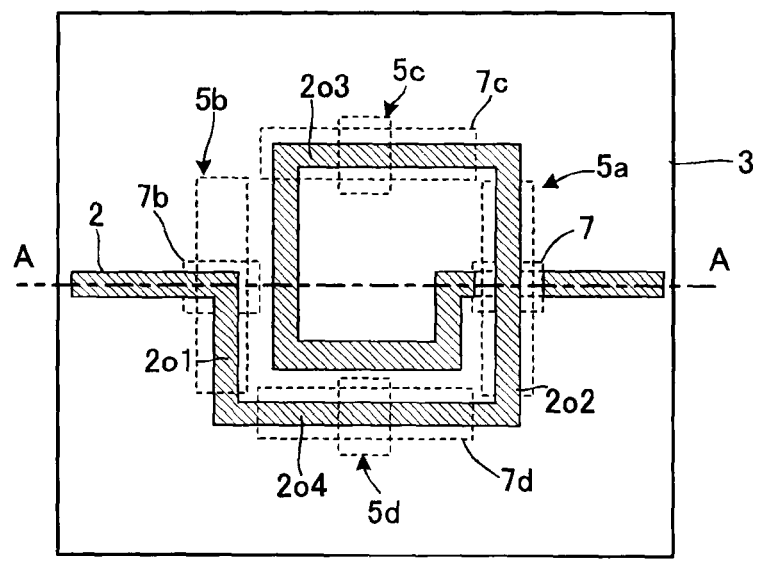
FIG. 6 is a top view of a variable inductor of a third embodiment of the invention.

A third embodiment of the invention is now described by reference to the drawings. FIG. 6 is a schematic diagram of a variable inductor of the third embodiment.

As in the case with the first embodiment, the variable inductor 1 is populated on the semiconductor integrated circuit board (the silicon substrate 4) on which the CMOS semiconductor element including the transistor 20 or the capacitor 21 is populated, thereby making up the semiconductor integrated circuit device 100 (see FIGS. 3(a) and 3(b)). The variable inductor is illustrated in the embodiment, and other element regions are omitted.

As illustrated in FIG. 6, the variable inductor 1 is made up of the spiral inductor 2 formed over the surface of the silicon substrate 4 serving as a semiconductor substrate; four loop conductors formed in a direction perpendicular to the spiral inductor 2, or first through fourth loop conductors 5a through 5d; and first through fourth switches 7a through 7d.

The first and second loop conductors 5a and 5b are formed along two mutually-opposed sides 2o1 and 2o2 of the outermost periphery of the spiral inductor 2. The third and fourth loop conductors 5c and 5d are formed along another pair made up of two mutually-opposed sides 2o3 and 2o4 of the outermost periphery of the spiral inductor 2.

The respective loop conductors are the same as the loop conductor 5 described in connection with the first embodiment. The variable inductor 1 has one additional loop conductor of the same kind that opposes its counterpart loop conductor. The respective loop conductors are alike in shape and each include switches 7. Respective single ends of the first through fourth loop conductors 5a through 5d are opened or short-circuited by the first through fourth switches 7a through 7d, whereby the inductance value of the spiral inductor 2 can be changed.

Since the variable inductor 1 is the same as its counterpart variable inductor described in connection with the first and second embodiments in terms of other configurations, their repeated explanations are omitted. Like parts are given like reference numerals.

As illustrated in FIG. 6, loop conductors are formed along the four sides 2o1, 2o2, 2o3, and 2o4 of the outermost periphery of the lower portion of the spiral inductor 2. The first through fourth loop conductors 5a, 5b, 5c, and 5d are provided so as to be formed in the vertical direction with respect to the four directions. Since the first through fourth loop conductors 5a, 5b, 5c, and 5d are respectively turned on or off by the first through fourth switches 7a, 7b, 7c, and 7d, the induced currents flowing through the four loop conductors can be controlled, so that the inductance value can be greatly controlled.

In the configuration of the embodiment, it is desirable that the first through fourth loop conductors 5a, 5b, 5c, and 5d be formed so as to become as equal to the width of the two pairs made up of the mutually-opposed sides 2o1, 2o2, 2o3, and 2o4 of the outermost periphery of the spiral inductor 2 as possible. The reason for this is to prevent leakage of a magnetic flux. The configuration makes it possible to maximize mutual inductance and a control range of inductance.

The variable inductor described in connection with the embodiment is used in the matching circuit of the high frequency circuit. The matching status of the matching circuit can be controlled within a greater range, and matching can be controlled at a wider frequency band.

(Fourth Embodiment)

A fourth embodiment of the invention is now described by reference to the drawings.

Figure 7:
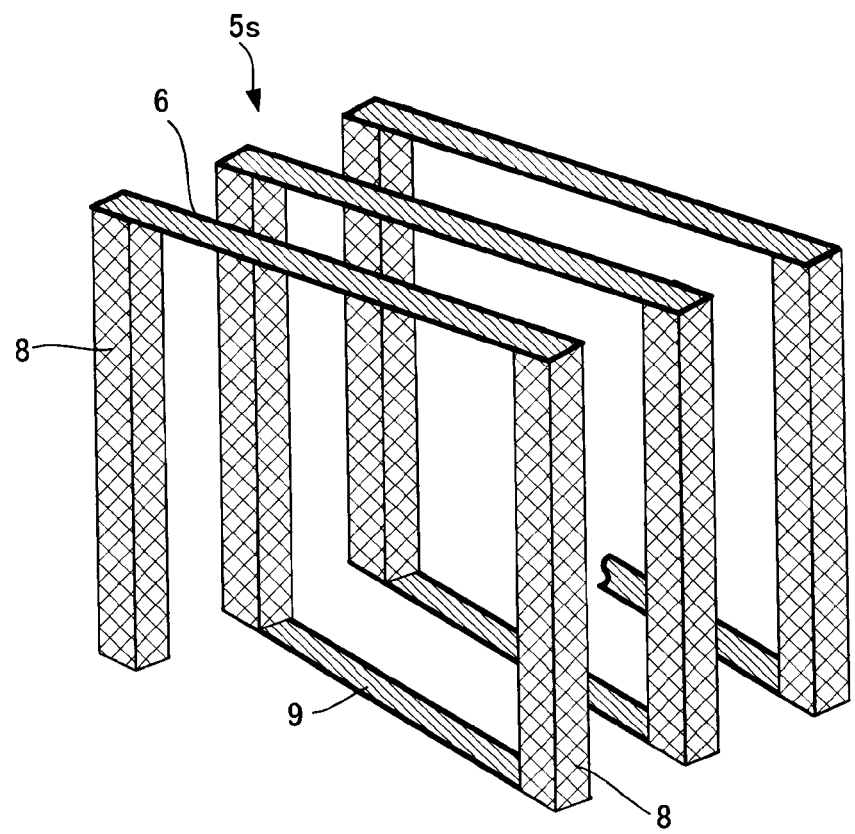
FIG. 7 is a perspective view illustrating a loop conductor of a variable inductor of a fourth embodiment of the invention.
Figure 8:
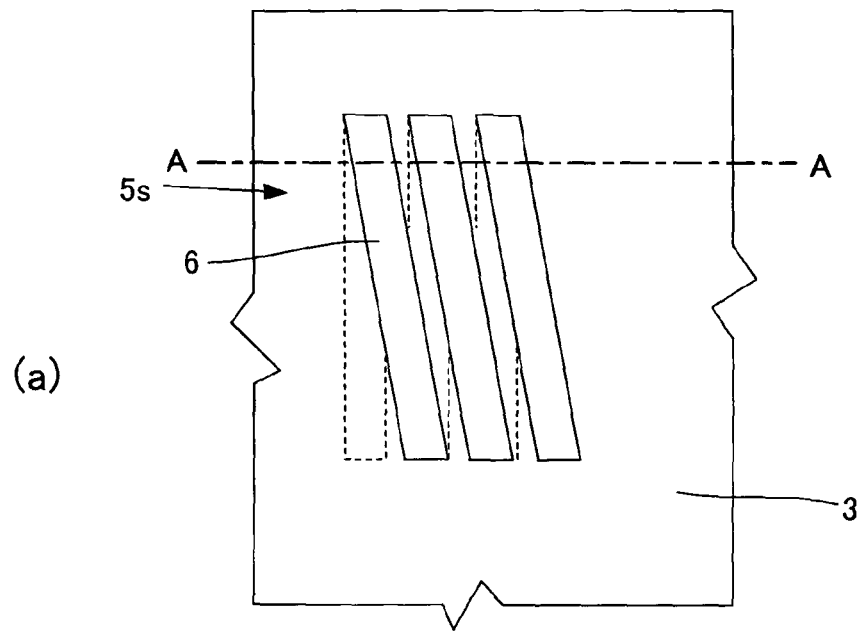
FIG. 8 is drawings illustrating the variable inductor of the fourth embodiment of the invention, wherein (a) is a top view and (b) is a cross sectional view taken along line A-A illustrated in (a).
Figure 8:
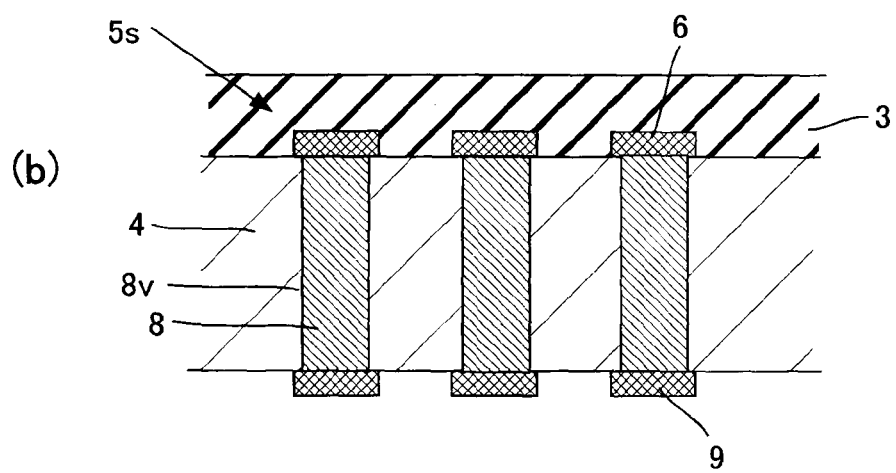

FIG. 7 is a perspective view illustrating a loop conductor of a variable inductor of a fourth embodiment, and FIG. 8(a) is a top view and FIG. 8(b) is a cross sectional view taken along line A-A illustrated in FIG. 8(a).

Although the number of turns of each loop conductor is one in the first through third embodiments, the number of turns is set to three in this embodiment.

Even in this configuration, each of the loops includes three parallel aluminum layer patterns as the inner layer conductor 6, three parallel aluminum layer patterns as the backside conductor 9, and six parallel vertical conductors 8 as in the case with the first through third embodiments. Each of the loop conductors forms a spiral loop.

The three parallel aluminum layer patterns serving as the inner layer conductor 6 are placed on a lower layer side with respect to the surface conductor that makes up the spiral inductor 2, by way of the interlayer dielectric film 3. The three parallel aluminum layer patterns serving as the backside conductor 9 are formed on the back side of the silicon substrate 4. The six parallel vertical conductors 8 are formed in the pass-through vias that pass through the silicon substrate 4.

A switch (not shown) for use in opening or short-circuiting one end of the loop conductor is provided.

The variable inductor is alike its counterpart variable inductors described in connection with the first and second embodiments in terms of other configurations, and hence their repeated explanations are omitted. Like parts are given like reference numerals.

Even the variable inductor 1 is populated, as in the first embodiment, on the semiconductor integrated circuit board (the silicon substrate 4) on which the CMOS semiconductor element including the transistor 20 or the capacitor 21 is populated without increasing the area of the variable inductor 1, thereby making up the semiconductor integrated circuit device 100. Control, however, becomes more efficient, and the matching state of the matching circuit can be controlled over a much greater range, and matching can be controlled in a broad frequency band.

(Fifth Embodiment)

A fifth embodiment of the invention is now described by reference to the drawings.

Figure 9:
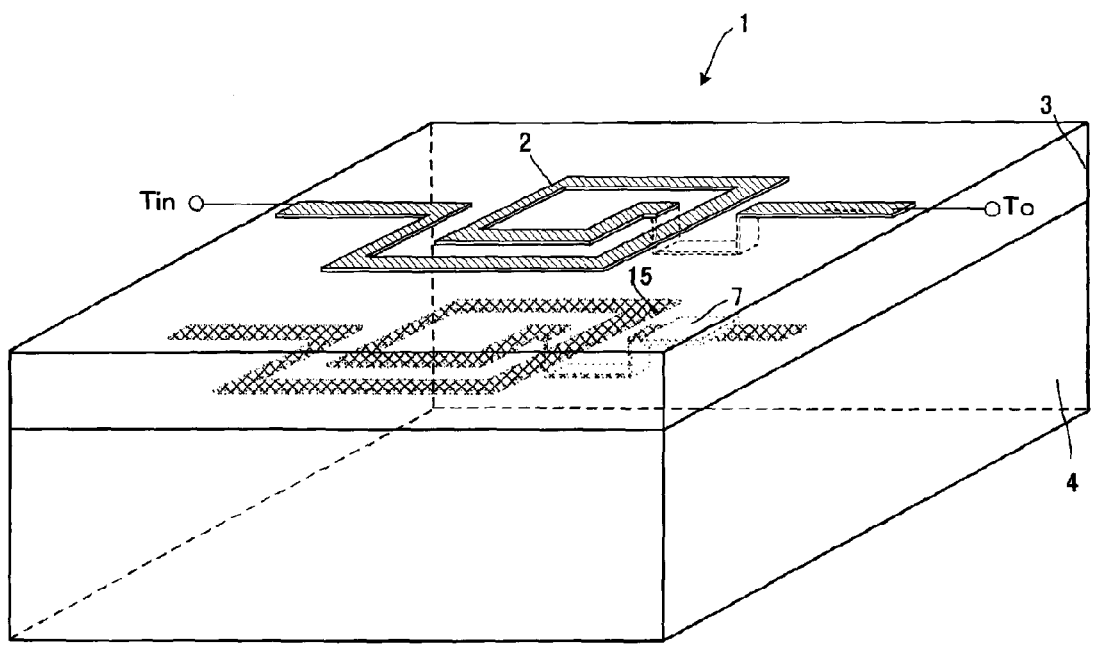
FIG. 9 is a perspective view illustrating a loop conductor of a variable inductor of a fifth embodiment of the invention.

FIG. 9 is a perspective view illustrating a variable inductor of a fifth embodiment, and FIG. 10(a) is a top view of the spiral inductor 2 of the variable inductor, FIG. 10(b) is a top view of the loop conductor 5, and FIG. 10(c) a cross sectional view taken along line A-A illustrated in FIG. 10(a).

In the first through fourth embodiments, the loop conductors are provided at right angles to the surface of the substrate. In contrast, the variable inductor of the embodiment is provided with a loop conductor 15 that is placed in parallel to the spiral inductor 2 by way of the interlayer dielectric film 3.

The loop conductor 15 is formed by use of a pattern similar to that used for the spiral inductor 2 and in parallel to the spiral inductor 2 by way of the interlayer dielectric film 3. Consequently, leakage of the magnetic flux is substantially prevented, and mutual inductance can be increased, because the loop conductor 15 and the spiral inductor 2 are positioned in close proximity to each other. Therefore, the control range of inductance can be maximized.

In the configuration, the loop conductor 15 is formed from a spiral aluminum layer pattern 6s, which is placed on the lower layer side and which acts as the inner layer conductor 6, in parallel to the surface conductor that makes up the spiral inductor 2, by way of the interlayer dielectric film 3.

In the configuration, the loop conductor 15 is formed from a planar pattern except that the aluminum layer pattern 6s, which acts as the inner layer conductor 6, is connected by a via 18 to form the loop. For this reason, fabrication of the variable inductor becomes further facilitated. Here, the loop conductor can be a single-turn loop.

The variable inductor is alike its counterpart variable inductors described in connection with the first through fourth embodiments in terms of other configurations, and hence their repeated explanations are omitted. Like parts are given like reference numerals.

Even the variable inductor 1 is populated, as in the first embodiment, on the semiconductor integrated circuit board (the silicon substrate 4) on which the CMOS semiconductor element including the transistor 20 or the capacitor 21 is populated without increasing the area of the variable inductor 1, thereby making up the semiconductor integrated circuit device 100. Control, however, becomes more efficient, and the matching state of the matching circuit can be controlled over a much greater range, and matching can be controlled in a broad frequency band.

(First Modification)

Figure 10:
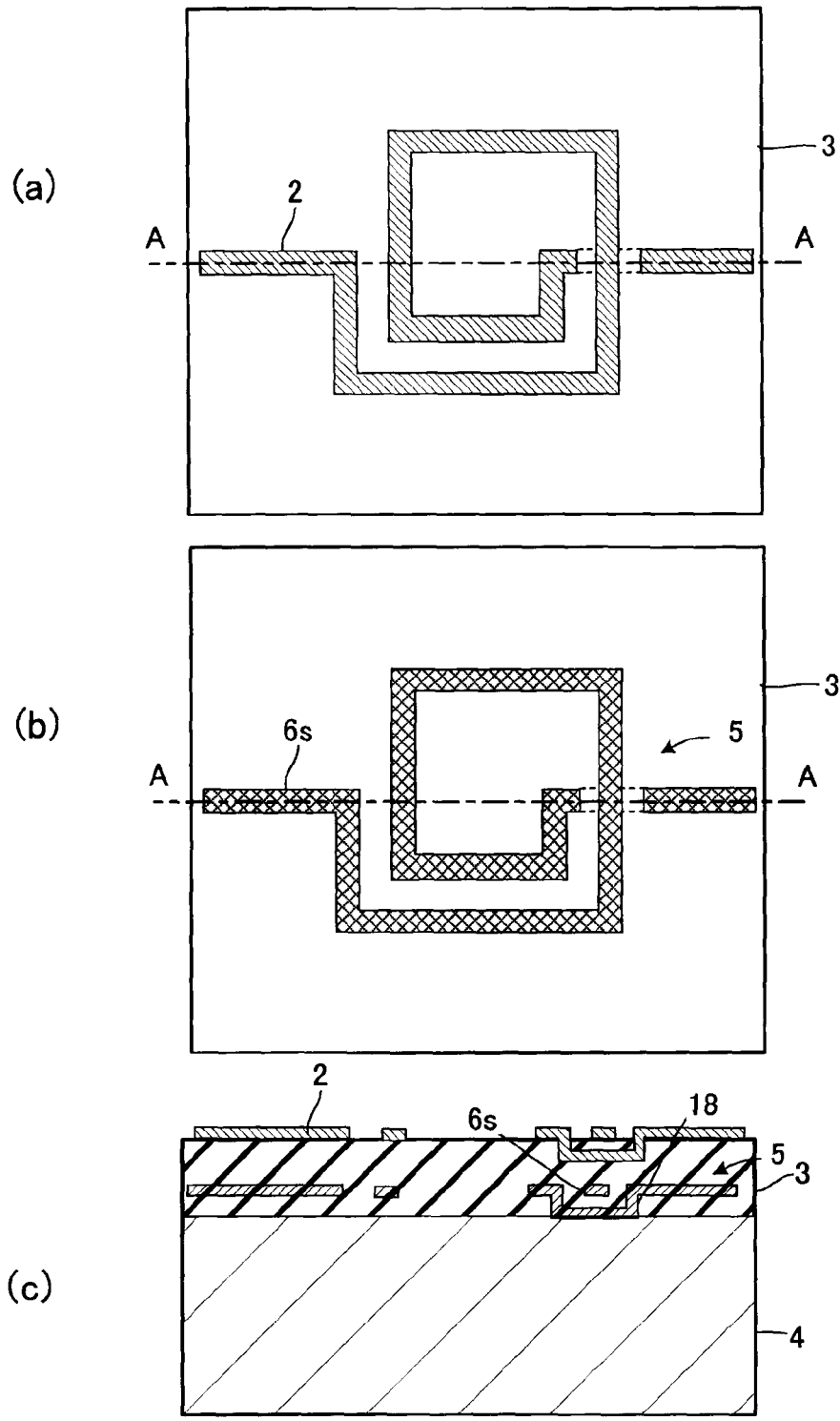
FIG. 10 is drawings illustrating the variable inductor of the fifth embodiment of the invention, wherein (a) is a top view of a spiral inductor 2 of the variable inductor, (b) is a top view of the loop conductor, and (c) is a cross sectional view taken along line A-A illustrated in (a).
Figure 11:
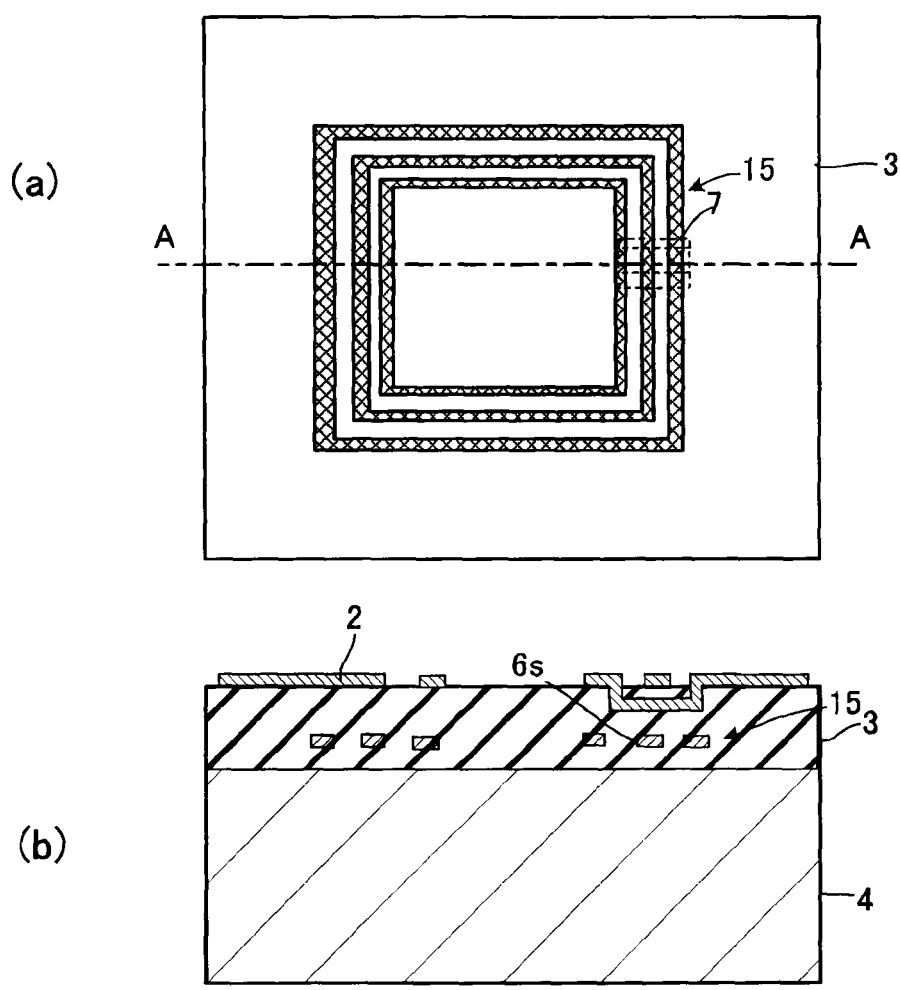
FIG. 11 is drawings illustrating a loop conductor of the variable inductor of a first modification of the fifth embodiment of the invention, wherein (a) is a top view and (b) is a cross sectional view taken along line A-A illustrated in (a).

As illustrated in FIGS. 11(a) and 11(b) that are a top view and a cross sectional view of a loop conductor, or a modification of the loop conductor illustrated in FIG. 10, a loop conductor having a plurality of loops; for instance, three loops, so as to make up a concentric body, can be employed. In this configuration, pattern formation is completed by use of one layer, and hence fabrication of the variable inductor is simple. A closed loop can be formed every turn, and in this case a pattern length required to form a closed loop in each turn becomes shorter. However, in this case, the switch 7 must be formed for each loop. FIG. 11(b) is a cross sectional view taken along line A-A illustrated in FIG. 11(a).

(Second Modification)

Figure 12:
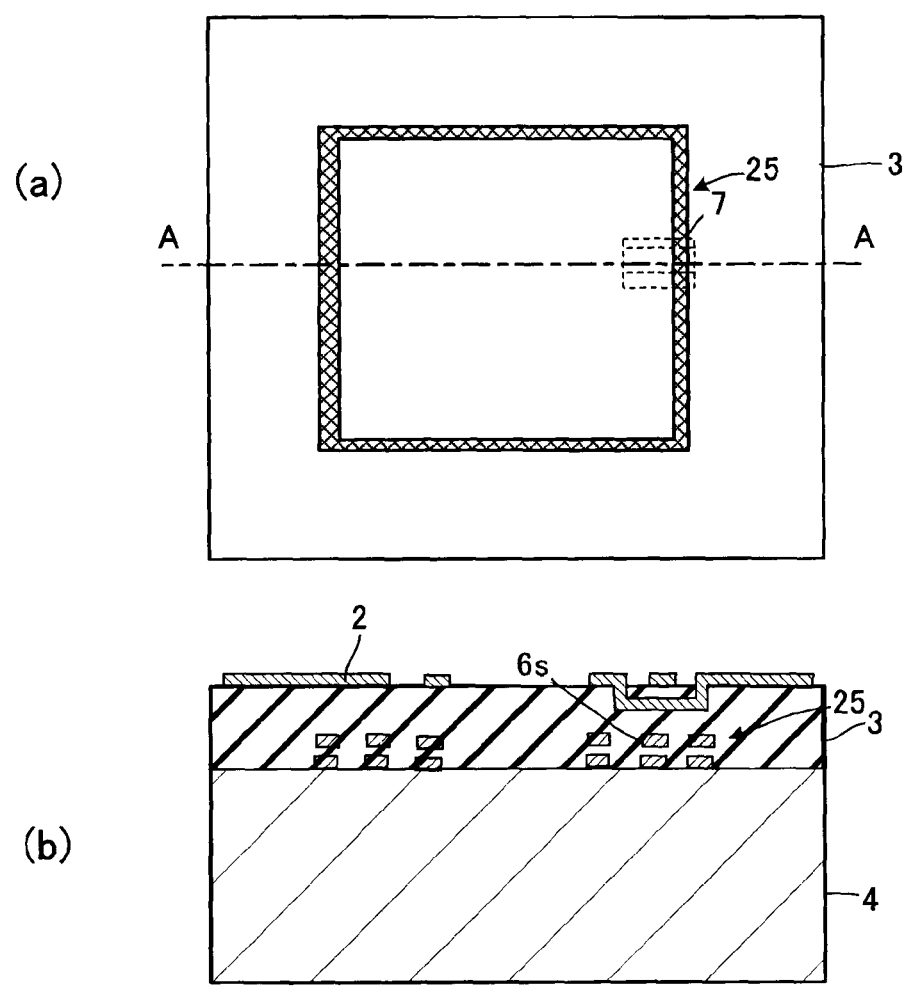
FIG. 12 is drawings illustrating a loop conductor of the variable inductor of a second modification of the fifth embodiment of the invention, wherein (a) is a top view and (b) is a cross sectional view taken along line A-A illustrated in (a).
Figure 13:
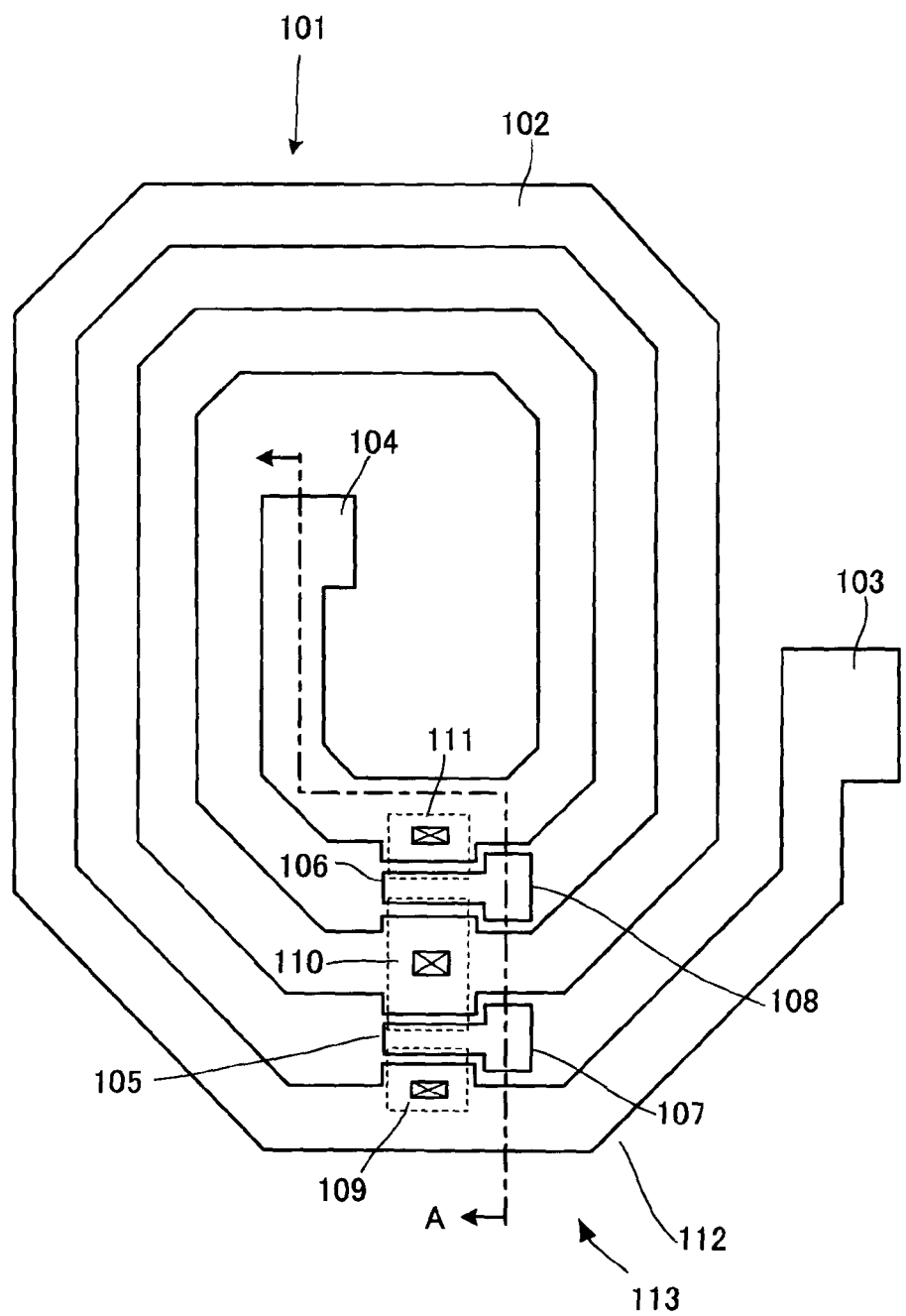
FIG. 13 is a schematic diagram of a related art variable inductor.
Figure 14:
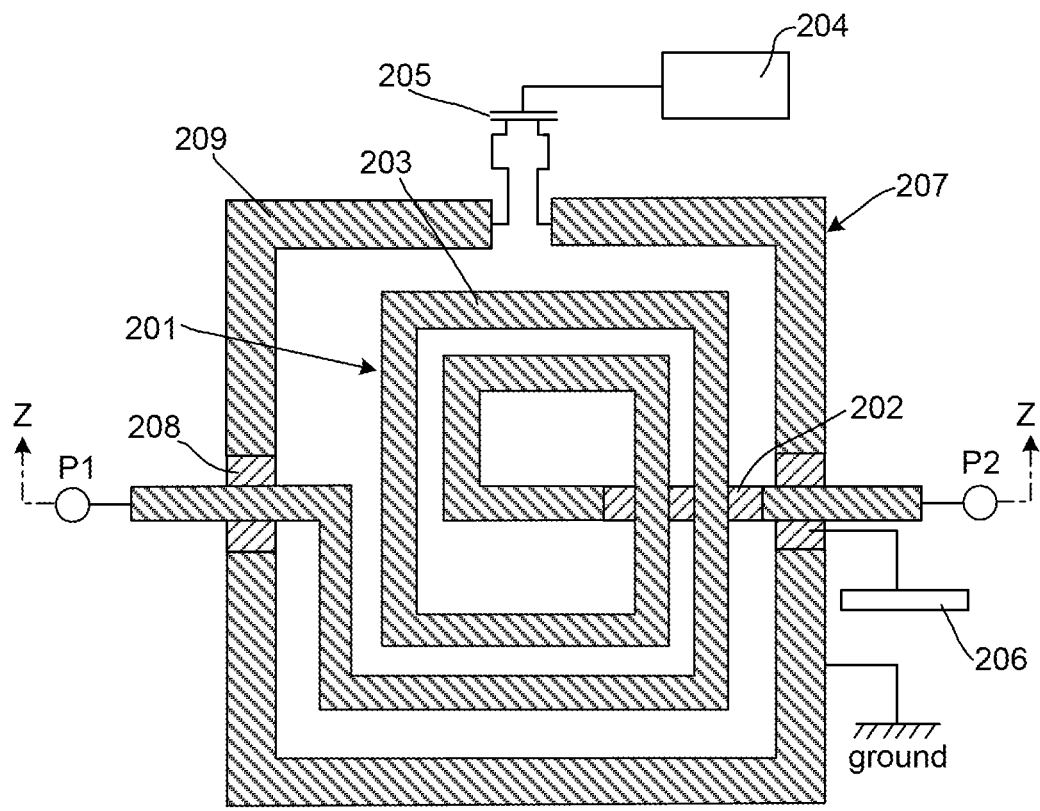
FIG. 14 is a schematic diagram of the related art variable inductor.

As illustrated in FIGS. 12(a) and 12(b) that are a top view and a cross sectional view of a loop conductor, or a modification of the loop conductor that has a plurality of loops making up a concentric body and that is illustrated in FIGS. 11(a) and 11(b), two loop conductors 25 can also be formed by use of a two-layer structure.

The switch 7 for use in opening or short-circuiting one end of the loop conductor is provided.

Although aluminum and gold are used for the loop conductors in the embodiments, another metallic conductor can also be used. Alternatively, a surface conductor or a backside conductor can also use a conductor material that is different from a conductor material of the conductor formed inside the via, such as the pass-through via.

Although the embodiments have descried the examples in which the variable inductor are formed in an integrated manner in the silicon substrate that makes up a silicon device, the variable inductor can also be integrated in a device other than the silicon substrate; for instance, a compound semiconductor device including HEMT or HBT, a GaAs device, an InP device, or a GaN device. The essential requirement for the compound semiconductor device is to include a conductor material satisfying a predetermined condition, including a work function, other than aluminum or gold, and single-layer metal or multilayer metal can also be used.

The present patent application is based on Japanese Patent Application (JP-2011-073445) filed on Mar. 29, 2011, the subject matter of which is incorporated herein by reference in its entirety.

INDUSTRIAL APPLICABILITY

The variable inductor of the invention yields the following advantage. Specifically, a loop conductor that uses a via; for instance, a pass-through via penetrating through a silicon substrate, is formed in a lower portion of a spiral inductor in a vertical direction, and a portion of the loop conductor is opened or short-circuited by use of a switch, thereby controlling an induced current flowing through the loop conductor. Thus, an inductance value is made variable. Therefore, the variable inductor is effective as a variable inductor that is employed in a matching circuit that has small capacitance and that is difficult to control, like a millimeter wave frequency band matching circuit.

The variable inductor of the invention can also be integrated in a silicon device including a CMOS device, a compound semiconductor device including HEMT or HBT, a GaAs device, and an InP device or a GaN device.

DESCRIPTIONS OF THE REFERENCE NUMERALS AND SYMBOLS

1 VARIABLE INDUCTOR
2 SPIRAL INDUCTOR
3 INTERLAYER DIELECTRIC FILM
4 SILICON SUBSTRATE
5, 5s, 15, 25 LOOP CONDUCTOR
5a FIRST LOOP CONDUCTOR
5b SECOND LOOP CONDUCTOR
5c THIRD LOOP CONDUCTOR
5d FOURTH LOOP CONDUCTOR
6 INNER LAYER CONDUCTOR
7 SWITCH
7G GATE ELECTRODE
7S SOURCE REGION
7D DRAIN REGION
7a FIRST SWITCH
7b SECOND SWITCH
7c THIRD SWITCH
7d FOURTH SWITCH
8 VERTICAL CONDUCTOR
8v PASS-THROUGH VIA
9 BACKSIDE CONDUCTOR
18 VIA
20 TRANSISTOR
21 CAPACITOR
100 SEMICONDUCTOR INTEGRATED CIRCUIT DEVICE
101 INDUCTANCE VARIABLE ELEMENT
102 SPIRAL ELECTRODE
103, 104 INPUT-OUTPUT ELECTRODE
105, 106 SWITCH
107, 108 GATE ELECTRODE
109, 110, 111 DIFFUSION REGION
112 DIELECTRIC LAYER
113 Si SUBSTRATE
201 SPIRAL COIL
202 FIRST LAYER OF SPIRAL COIL
203 SECOND LAYER OF SPIRAL COIL
204 CONTROL CIRCUIT
205 SWITCH
206 SILICON SUBSTRATE
207 CIRCUMFERENTIAL WIRING
208 FIRST LAYER OF CIRCUMFERENTIAL WIRING

The invention claimed is:

1. A variable inductor comprising:
a spiral inductor arranged in a plane on a semiconductor substrate;
a loop conductor including an opening that is arranged in one or more layers which are lower than the plane occupied by the spiral inductor and includes a first layer conductor and a second layer conductor;
a dielectric layer arranged between the loop conductor and the spiral inductor; and
a switch adapted to open or close a loop of the loop conductor, the dielectric layer being arranged between the switch and the spiral inductor;
wherein the first layer conductor and the second layer conductor of the loop conductor define a plane, the plane defined by the first layer conductor and the second layer conductor of the loop conductor is arranged in a direction perpendicular to and beneath the plane occupied by the spiral inductor.

2. The variable inductor according to claim 1, wherein the spiral inductor is formed on one surface of the semiconductor substrate; and wherein the
first layer conductor is formed in a layer which is lower than the spiral inductor;
the second layer conductor is formed in a layer which is lower than the first layer conductor; and the variable inductor further comprises:
a vertical conductor formed in a via which is formed in at least a
part of the semiconductor substrate and in a direction perpendicular to the one surface of the semiconductor substrate, the vertical conductor connecting the first layer conductor to the second layer conductor.

3. The variable inductor according to claim 2, wherein the semiconductor substrate is a silicon substrate;
wherein the spiral inductor is formed from a surface conductor formed on a topmost layer of the silicon substrate;
wherein the first layer conductor is an inner layer conductor positioned at a lower layer side with respect to the surface conductor through an interlayer dielectric film;
wherein the second layer conductor is a backside conductor formed on a back side of the silicon substrate; and
wherein the loop conductor includes:
the inner layer conductor;
the vertical conductor formed in a pass-through via which penetrates through the silicon substrate; and
the backside conductor; and
the switch adapted to open or close a loop of the loop conductor.

* * * * *